United States Patent
Kho et al.

(10) Patent No.: US 12,123,746 B2
(45) Date of Patent: Oct. 22, 2024

(54) SENSOR WITH HOUSING AND SILICONE RESIN FILLER

(71) Applicant: TDK Electronics AG, Munich (DE)

(72) Inventors: Abraham Kho, Singapore (SG); Andi Permana, Kepri (ID); Heinz Strallhofer, Deutschlandsberg (AT)

(73) Assignee: TDK Electronics AG, Munich (DE)

( * ) Notice: Subject to any disclaimer, the term of this patent is extended or adjusted under 35 U.S.C. 154(b) by 311 days.

(21) Appl. No.: 17/633,334

(22) PCT Filed: Jun. 15, 2021

(86) PCT No.: PCT/EP2021/066067
§ 371 (c)(1),
(2) Date: Feb. 7, 2022

(87) PCT Pub. No.: WO2021/255005
PCT Pub. Date: Dec. 23, 2021

(65) Prior Publication Data
US 2022/0291053 A1  Sep. 15, 2022

(30) Foreign Application Priority Data

Jun. 17, 2020 (DE) .......................... 102020116018.6

(51) Int. Cl.
*G01D 11/24* (2006.01)
*G01K 1/08* (2021.01)
*G01R 22/00* (2006.01)

(52) U.S. Cl.
CPC ............. *G01D 11/245* (2013.01); *G01K 1/08* (2013.01); *G01R 22/00* (2013.01)

(58) Field of Classification Search
CPC ......... G01D 11/245; G01K 1/08; G01R 22/00
See application file for complete search history.

(56) References Cited

U.S. PATENT DOCUMENTS

| | | |
|---|---|---|
| 3,824,328 A | 7/1974 | Ting et al. |
| 6,555,052 B2 | 4/2003 | Soga et al. |
| 7,663,469 B2 | 2/2010 | Sato |
| 7,780,348 B2 | 8/2010 | Houben et al. |
| 7,969,278 B2 * | 6/2011 | Kato ........................ H01C 1/14 338/28 |

(Continued)

FOREIGN PATENT DOCUMENTS

| | | |
|---|---|---|
| CN | 105258820 A | 1/2016 |
| CN | 107883861 A | 4/2018 |

(Continued)

OTHER PUBLICATIONS

Little, A., "High performance resins to protect electronic systems," URL: https://www.all-electronics.de/powerful-resins-for-protection-of-el., Oct. 24, 2016, 15 pages.

*Primary Examiner* — Kyung S Lee
(74) *Attorney, Agent, or Firm* — Slater Matsil, LLP

(57) ABSTRACT

In an embodiment a sensor includes a sensor element, electrical leads connected to the sensor element, a housing having an opening, wherein the sensor element is arranged in the housing such that the electrical leads protrude through the opening and a first silicone resin filling the housing such that the sensor element and the electrical leads are fixed in the housing.

18 Claims, 3 Drawing Sheets

(56) References Cited

U.S. PATENT DOCUMENTS

| | | |
|---|---|---|
| 8,092,085 B2 | 1/2012 | Kawase et al. |
| 10,024,725 B2 | 7/2018 | Ihle et al. |
| 10,533,880 B2 | 1/2020 | Islam Ahmad |
| 2006/0013282 A1* | 1/2006 | Hanzawa .............. G01K 7/22 374/E1.021 |
| 2010/0091817 A1 | 4/2010 | Wienand et al. |
| 2013/0208765 A1* | 8/2013 | Takahashi ............ G01K 7/22 374/185 |
| 2013/0248777 A1* | 9/2013 | Sgriccia ............... H01B 1/02 252/514 |
| 2021/0404882 A1* | 12/2021 | Suzuki ................. G01K 1/08 |

FOREIGN PATENT DOCUMENTS

| | | |
|---|---|---|
| CN | 108088577 A | 5/2018 |
| CN | 106225945 B | 10/2018 |
| DE | 2351956 A1 | 4/1974 |
| DE | 29913950 U1 | 12/2000 |
| DE | 10360542 A1 | 7/2005 |
| DE | 60130065 T2 | 5/2008 |
| DE | 102019129521 A1 | 3/2021 |
| EP | 2093548 B1 | 3/2017 |
| JP | S5931427 A | 2/1984 |
| JP | 2001141573 A | 5/2001 |
| JP | 2007165418 A | 6/2007 |
| JP | 2008203031 A | 9/2008 |
| JP | 2009300237 A | 12/2009 |
| JP | 2010032237 A | 2/2010 |
| JP | 2012211792 A | 11/2012 |
| JP | 2015534083 A | 11/2015 |
| JP | 2019184287 A | 10/2019 |
| KR | 101010181 B1 | 1/2011 |
| WO | 2008156082 A1 | 12/2008 |
| WO | 2016068107 A1 | 5/2016 |

* cited by examiner

SENSOR WITH HOUSING AND SILICONE RESIN FILLER

This patent application is a national phase filing under section 371 of PCT/EP2021/066067, filed Jun. 15, 2021, which claims the priority of German patent application 102020116018.6, filed Jun. 17, 2020, each of which is incorporated herein by reference in its entirety.

TECHNICAL FIELD

The present invention concerns a sensor. In addition the present invention relates to an arrangement employing the sensor and a method for assembling the sensor.

BACKGROUND

Sensors are employed in most electronic devices nowadays. Accounting just smart sensor, the sales quantity worldwide has increased from 6 billion sensors in 2010 to estimated 26 billion in 2019. It is foreseeable that with the rise of the Internet-of-Things and the demand for smarter devices this number will increase even more. Since ecologically questionable materials are usually used in sensors, disposal will also become a challenge in the future.

A modern smartphone commonly has at least a proximity sensor, a brightness sensor, a tilt sensor, a rotational sensor, an accelerometer, a GPS-sensor, a magnetic sensor and a thermometer build in.

For sensors it is desirable to provide a reliable, reproducible measurement of the sensor on the one hand, while making the sensor sustainable and less polluting.

SUMMARY OF THE INVENTION

Embodiments provide a sensor that is robust, protected, allows for reliable measurements and is environmentally friendly.

A sensor is provided which comprises a sensor element and electrical leads. The electrical leads are connected to the sensor element. Further, a housing is provided. The housing has an opening and the sensor element and the electrical leads are arranged in the housing such that the electrical leads protrude through the opening. The housing is filled with a silicone resin and the sensor element and the electrical leads are fixed in the housing by the silicone resin.

Common filling materials for sensors, as alumina oxide or silicon oxide for example, need a solvent as toluene, xylene or IPA to be processed. As a consequence, voids, vesicles and bubbles occur after curing, which cannot be avoided. These inclusion leads to an inhomogeneous surrounding of an employed sensor element. As a result, measurements taken with the sensor fluctuates strongly depended on the number and the spatial distribution of the inhomogeneities in the filling material. Therefore, in these sensors the response time and the measured value varies and allows no reliable measurement. By employing polymeric resins, as silicone or epoxy, as the filling and fixing material in the housing of the sensor, voids, vesicles and other inhomogeneities are avoided. Polymeric resins provide a homogenous heat transfer from the environment to the sensor element resulting in a fast thermal response and less variations in the response time of the sensor. As a consequence the reliability of the measurement of a sensor is improved.

In applications in which the sensor has to endure temperature rises a filling resin will expand due to the thermal expansion coefficient. A confinement of the resin, as the housing of the sensor, induces a thermomechanical stress on the encased sensor element during temperature changes. A relative low thermomechanical stress can already disturb the measurement of the sensor. Even more so if the sensor element is pressure sensitive. A high thermomechanical stress can result in a failed sensor, either by disengaging the connections between the electrical leads to the sensor element or by breaking the sensor element itself. As silicone resin has, compared to metal oxides or epoxy resin, a much higher elastic modulus, it applies way less stress on the sensor element and the electrical leads at a temperature gradient leading to a more robust sensor.

Moreover, a silicone resin can endure higher long term temperatures in contrast to an epoxy resin. A continuous operating temperatures up to 200° C. is feasible with a silicone resin, against which an epoxy resin already degrades at 150° C. Hence a sensor implementing a silicone resin is superior for applications generating or exposed to high temperatures.

Further, silicone is inert and does not react with other chemicals, elements or compounds, even at high temperatures. There are no known health hazards of silicone. Silicone is not biodegradable, nevertheless it can be recycled and downcycled easily. Therefore, a silicone resin is ecologically friendlier than other alternatives.

The silicone resin may be a hard silicone material. The hard silicone is more rigid than a soft silicone. Thus, the sensor element is fixed more precise in the housing and the position of the sensor element inside the housing does not vary. Additionally, a hard silicone can offer more protection for the sensor element.

In one embodiment the sensor element can be encapsulated in a silicone resin material, while the housing may be filled with the same silicone resin material, and the encapsulated sensor element may be fixed to the housing by the same silicone resin material. By using the same material to encapsulate the sensor element and to fix the sensor element inside the housing a boundary surface is omitted, which would occur if two different materials were used. This boundary surface and could be hindering and disturb a measurement.

The sensor element can be connected to the electrical leads by a lead-free solder. Lead can easily form a low melting temperature alloy with a lot of metals that can be used in the electrical leads. A Sn platting on the electrical leads, for example, can generate a low temperature melting SnPb-alloy with a lead solder. Utilizing a lead-free solder eliminates the risk of forming such alloys at the solder process, and ensures hereby a proper function of the sensor up to 200° C. Furthermore, lead is a toxic metal which contaminates the environmental and can induce significant health problems. By omitting lead for contacting the electrical leads to the sensor element, the sensor becomes friendlier to environmental.

For example, the solder can comprise Sn—Cu or Sn—Ag—Cu (SAC) solder. Those solders alloys exhibit a much higher melting point than lead-solders and enable the sensor to operate at a higher temperature. The melting point of Sn—Cu or Sn—Ag—Cu (SAC) solder is at about 220° C. Therefore, a sensor utilizing the proposed solder and silicone resin can withstand higher a higher temperature. A content of less than 1% Cu is preferred. It is also possible to add Ni in the solder alloy for avoiding void formation and cracks.

In a preferred embodiment the housing may be made out of a metal oxide or a ceramic. It is beneficial to make the housing out of a metal oxide as metal oxides have the advantageous properties of a high stability and relatively high thermal conductivity. In addition, they are also good electrical insulators, so that a sensor with such a housing is suitable for high-voltage applications. However, a few kV voltages can lead to short circuits, mainly between the protruding leads and the housing, especially if the housing would consist of an electrical conductor, as a metal. Forming the housing out of a metal oxide enables the sensor to operate at voltages up to 5 kV. By a metal oxide or ceramic housing, the sensor is suitable for applications under harsh operating conditions and is resistant to aggressive media such as acids and bases.

The sensor element can be an NTC sensor element. As NTC sensors are used to measure the temperature of the surrounding, it is demanded to enable a direction-independent measurement. Especially in security systems which are triggered by a rise in temperature, it is necessary to allow for a reliable and direction-independent measurement. Alternately the sensor element can be a PTC sensor element or a sensor element using the temperature dependence of the electrical resistance of platinum.

A wall thickness of the housing can be less than 2 mm. On the one hand, the wall thickness of the housing should be thick enough to protect the sensor element inside the housing. On the other hand, the housing should not isolate the environment from the sensor element in order not to impair the sensitivity of the sensor. A wall thickness of less than 2 mm has proven to be advantageous. A wall thickness of less than 1 mm and more than 0.5 mm is particularly advantageous.

Moreover, the electrical leads may be kinked in a portion of the electrical leads that are located inside of the housing. By kinking the leads it can be ensured that both leads do not contact each other and do not short-circuit. Besides, kinking the leads may induce a lateral force to support the latching of the electrical leads in potential grooves on the inside of the housing. Likewise, the spring tension of the electrical leads generated by kinking is helpful to handle the sensor element during the potting process wherein the sensor element is deposited into the housing as well as to handle the whole sensor if the sensor is mounted or installed into an application.

The housing may have two grooves at an inner surface of the housing. The grooves may extend from the opening along a longitudinal axis into the housing. Inside the grooves the electrical leads connected to the sensor element can be arranged. In this way the orientation of the sensor element inside the housing is fixed relatively to the housing.

Furthermore, the housing's outer shape can be radial asymmetrical. Moreover, the housing can have a longitudinal axis and the housing can be not radial symmetric with respect to rotations around its longitudinal axis by a rotational angle other than 180°. Accordingly, the direction the sensor element is facing in the housing as well as the direction of the housing in a device can be determined and fixed relatively to rotational asymmetry. The signal output of sensor elements often are not just dependent on the distance to an event measured but also on the angle the sensor element faces that event. For example, an NTC sensor element that faces a heat source directly will be exposed to more thermal energy than an NTC sensor that is orientated perpendicular to the heat source. By determining the direction of the sensor element in the housing and the direction of the housing in a device by its outer shape it is ensured that the sensor element works and measures reliable and reproducible values. Furthermore, the housing with a radial asymmetrical outer shape complies poka yoke. While assembling a device the sensor is used in, mistakes can be avoided by using a suitable connection to the housing. Additionally, the outer shape of the housing can have at least two flattened segments which are opposite to each other. The sensor can securely be picked at the flattened segment as the flattened segment provide means for a stable grip. Hence, the sensor also can easily be mounted and installed in a device by a pick-and-place machine.

In a preferred embodiment, the housing can be divided into two portions, a first portion which comprises the opening and a second portion opposing the side of the opening and connected to the first portion. The second portion can have a smaller diameter than the first portion and the sensor element can be arranged in the second portion of the housing. A sensor element arranged in the second portion has less material surrounding it compared to the first portion. This allows a higher measurement accuracy as well as a shorter response time for the sensor. At the same time the first portion of the housing, with a larger diameter, provides means for a better handling of the sensor and stabilizes the leads connected to the sensor element. Another advantage of the shape of the housing with two portions is that the sensor and the direction it is facing can be easily recognised by a machine, as a pick-and-place machine, and therefore can be easily processed. In this manner, the processing time to install the sensor in a device can be reduced due to the automatization.

It may be advantageous if the housing had a smaller wall thickness in the second portion than the wall thickness in the first portion. As the sensor element is located in the second portion, a smaller wall thickness can increase the coupling, thermally for example, to the environment and optimize the response time and the sensibility of the sensor.

An arrangement can comprise a sensor and a socket. The socket may have an inner shape which is adapted to the outer shape of the sensor, and the sensor can be arranged in the socket. Hence, the arrangement complies with the poka-yoke, minimizing possible mistakes while assembling the arrangement. A sensor element is located at the same position not just relative to the housing, but also to the socket. Hence, replacing the sensor does not change of measurement outcome because the orientation of the sensor element as well as the position stay the same.

The socket can have a hole, which is larger in extend than the extend of the second portion of the sensor. In a further arrangement the sensor can be arranged in this socket in such a way that the second portion of the sensor protrudes through the hole. A sensor element, which is located in the second portion, can hence measure more directly the properties outside of the socket, while maintaining the advantages given by the socket, as a reliable position and orientation of the sensor element. Therefore, such an arrangement can measure more exact.

Another arrangement can comprise a sensor or an arrangement and a printed circuit board (PCB), whereby the socket or sensor can be arranged on the PCB and the sensor can be electrically connected to the PCB. PCBs are equipped with a high number of heat generating components, as resistors, coils or chips such as processors. Being able to monitor the properties of this components, as the temperature, improves the security as the device employing the PCB can be shut down after a temperature rise. The sensor is especially suitable, as it measures more reliable.

Likewise, a smart power meter comprising a sensor or an arrangement comprising a sensor can be opportune. In smart power meters, in particular for buildings, high currents and voltages occur as the electricity from the power grid is distributed to the different households. For this reason any casualty, as a broken wire or corrosion, can lead to a catastrophic failure as a fire. Thus, a sensor that can reliably measure disturbances, as heat generation, can be used to warn or to shut down the power.

One advantage of the described sensor is that the assembling thereof can be done with a secure method.

The method comprises the following steps:
a) Connecting a sensor element to electrical leads by e.g. lead-free soldering,
b) Dipping the sensor element into silicone resin,
c) Curing the silicone resin on the sensor element,
d) Arranging the sensor in a housing which has an opening such that the electrical leads protrude through the opening,
e) Filling the housing with silicone resin,
f) Curing the silicone resin in the housing.

The process minimizes the loss and failure rates in the assembling process. By dipping the sensor element into silicone resin and curing it afterwards in step b) and c) the connection strength between the sensor element and the electrical leads is improved. Therefore, the connection between sensor element and the leads has a lower risk to break when the sensor element is arranged in the housing in step d). Besides, the sensibility of the sensor is improved because the same material, silicone resin, is used to encapsulate the sensor element with the electrical leads and to fill the housing. By using the same material no pronounced boundary surface occurs compared to a case where two different materials were used. As a consequence, the sensor element is more sensible and has a shorter response time to e.g. arising temperature differences.

BRIEF DESCRIPTION OF THE DRAWINGS

In the following the embodiments of the invention and a method of manufacture is described with reference to the figures. Same parts or parts with equivalent effect are referred to by the same reference numbers.

The figures serve solely to illustrate the invention and are therefore only schematic and not drawn to scale. Some parts may be exaggerated or distorted in the dimensions. Therefore, neither absolute nor relative dimensions can be taken from the figures. Identical or identically acting parts are provided with the same reference numerals.

DETAILED DESCRIPTION OF ILLUSTRATIVE EMBODIMENTS

Figure 1:
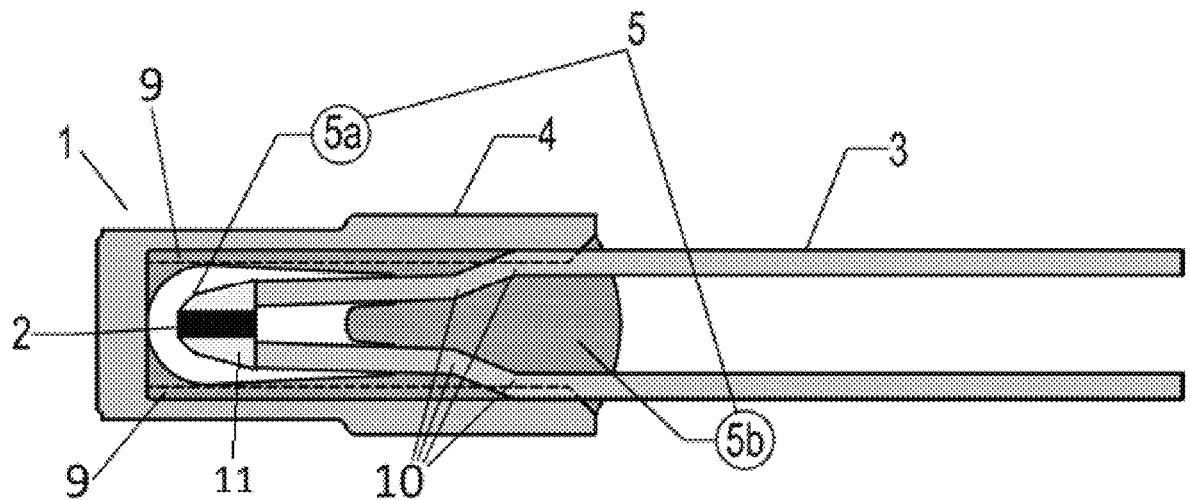
FIG. 1 shows a simplified cross section of a sensor.

In FIG. 1 a simplified cross section of a sensor 1 according to a first embodiment of the present invention is shown. A sensor 1 comprises a sensor element 2 and electrical leads 3. The sensor element 2 is connected to the electrical leads 3 by e.g. a lead-free solder 11.

Lead forms a low melting temperature alloy with a lot of metals, which is typically taken advantage of for a solder 11. Some examples of such alloys are babbit, cerrosafe, lead tin telluride, leaded copper, linotype, molybdochalkos, queen's metal or rose's metal. The melting point of such alloys is at about 150° C., and therefore would limit the temperature range the sensor 1 could be used in. By employing a lead-free solder 11, as Sn—Cu or Sn—Ag—Cu (SAC) solder 11, the sensor 1 can operate at higher temperatures, as he melting point of Sn—Cu or Sn—Ag—Cu (SAC) solder is at about 220° C. Moreover, lead is a toxic element which is environmentally destructive. It causes health issues, as lead poison, in humans and animals. Lead is also easily absorbed by plants, and is thereby introduced into the food cycle. By omitting lead solder 11 in the sensor 1, the sensor 1 is getting eco-friendlier.

Inside a housing 4, which has an opening, the sensor element 2 is arranged such that the electrical leads 3 protrude through the opening of the housing 4. Hence the sensor 1 can easily be installed and connected in a device. The housing 4 is filled with a silicone resin 5 and the sensor element 2 and the electrical leads 3 are fixed in the housing 4 by the silicone resin 5.

In particular, the sensor element 2 that is connected to the electrical leads 3 is first dipped into silicone resin and cured which forms a silicone resin encapsulation 5a. Afterwards, the encapsulated sensor element 2 is arranged in the housing 4 and the housing 4 is filled with a silicone resin filling 5b. Together, the silicone resin encapsulation 5a and the silicone resin filling 5b form the silicone resin 5 inside the housing 4. In this way, the material encapsulating the sensor element 2 is the same material which touches the inside of the housing 4 and fixes the sensor element 2 within the housing 4. By employing silicone for the encapsulation and the filling of the housing 4 the forming of a boundary surface is reduced, which on the contrary would be strongly developed if two different materials were used.

Polymeric materials as a potting material, as silicone, avoids bubble and void formation compared to metal oxides, which are widely used for potting. These inclusions cause an inhomogeneous surrounding of the sensor element 2 leading to unreliable measurements as the measurement value is depended on the spatial distribution of the inhomogeneities in the filling material. Sensors 1 utilizing a silicone resin 5 as a filling and fixing material in the housing 4 avoid inhomogeneities and hereby increase the reliability and reproducibility of the measurement of a sensor 1. Further, a silicone resin 5 can withstand humidity, increasing the applicable voltage to the sensor 1.

Compared to an epoxy resin, which is also a polymeric material, a silicone resin has some remarkable advantages. First, the silicone resin 5 has a larger elastic modulus leading to less thermomechanical stress on the sensor element 2 or the electrical leads 3 in the housing 4, in particular in applications, wherein high temperature gradients or a high temperature occurs. Second, a silicone resin 5 endures higher temperatures in contrast to an epoxy resin making a sensor 1 utilizing a silicone resin 5 even more suitable for high temperature applications, especially in combination with a lead-free solder 11. Moreover, a silicone resin 5 is inert and thus does not react with its environment, even at high temperatures. Therefore, as silicone resin 5 is not toxic, it is also ecologically friendlier.

The sensor element 2 in FIG. 1 is an NTC sensor element 2. NTC sensor elements 2 measure the temperature of the environment. Therefore, direction-independent measurements are desirable for NTC sensors. In particular security systems triggered by a temperature rise require reliable and direction-independent measurements to provide a reproducible behaviour in case of an emergency.

Inside the housing 4 two grooves 9 are arranged at an inner surface of the housing 4 which extend from the opening along a longitudinal axis till the bottom of the housing 4. Alternatively, the grooves may just be in a part of the housing 4 as in the first portion 6 forming the opening. Additionally, the electrical leads 3 have each two kinks 10 in portions inside the housing 4. Thereby, the electrical leads 3 form spring like elements forcing each other apart. As a consequence, both electrical leads 3 are spread apart and unlikely short-circuit. In the same way the lateral force caused by the kinks 10 of the electrical leads 3 presses the electrical leads 3 into the grooves 9 on the inside of the housing 4. In this manner the orientation of the sensor element 2 is fixed compared to the housing 4. Additionally, the lateral force applying on the electrical leads 3 is convenient during the potting or mounting process as it facilitates to handle the sensor 1 or the sensor element 2.

Figure 2:
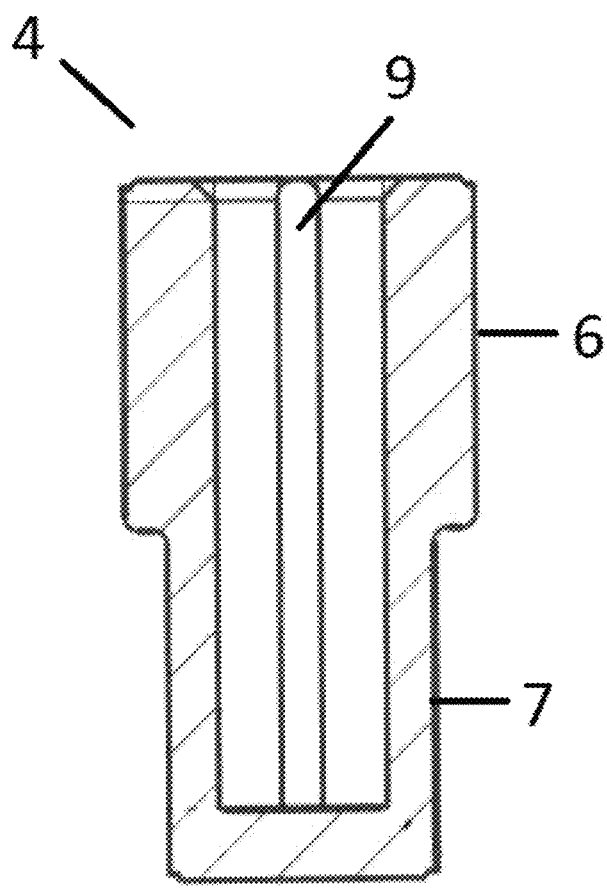
FIG. 2 shows a cross section of a housing for a sensor.

In FIG. 2 a cross section of the housing 4 for a sensor 1 is shown. The housing 4 has two portions, a first portion 6 which comprises the opening, on the upper side, and a second portion 7 opposing the side of the opening and connected to it, whereby the second portion 7 has a smaller diameter than the first portion 6. The grooves 9 extend from the opening all the way down to the bottom at an inner surface of the housing 4. The sensor element 2 is arranged in the second portion 7 of the housing 4 which has a smaller diameter. As the sensor element 2 has less material surrounding it, compared to the second portion 7, a higher measurement accuracy and faster response time for the sensor 1 are provided. The first portion 6 of the housing 4, which has a larger diameter, stabilizes the electrical leads 3 connected to the sensor element 2.

Additionally, the wall thickness of the second portion 7 of the housing 4 is smaller than the wall thickness of the first housing 4 to improve the thermal conductivity from the surrounding to the sensor element 2 and improve the response time of the sensor 1. The wall thickness of the housing 4, shown in FIG. 2, is 0.7 mm. The wall thickness of the housing 4 should be robust enough to withhold pressure applied to the sensor 1 while installing or mounting it to protect the sensor element 2. Apart from that the housing 4 is required to connect the environment thermally to the sensor element 2 to provide a high sensitivity. Wall thicknesses of less than 2 mm have shown to be advantageous, especially for temperature sensors. A wall thickness of less than 1 mm and more than 0.5 mm, as 0.7 mm, is particularly advantageous.

Figure 3:
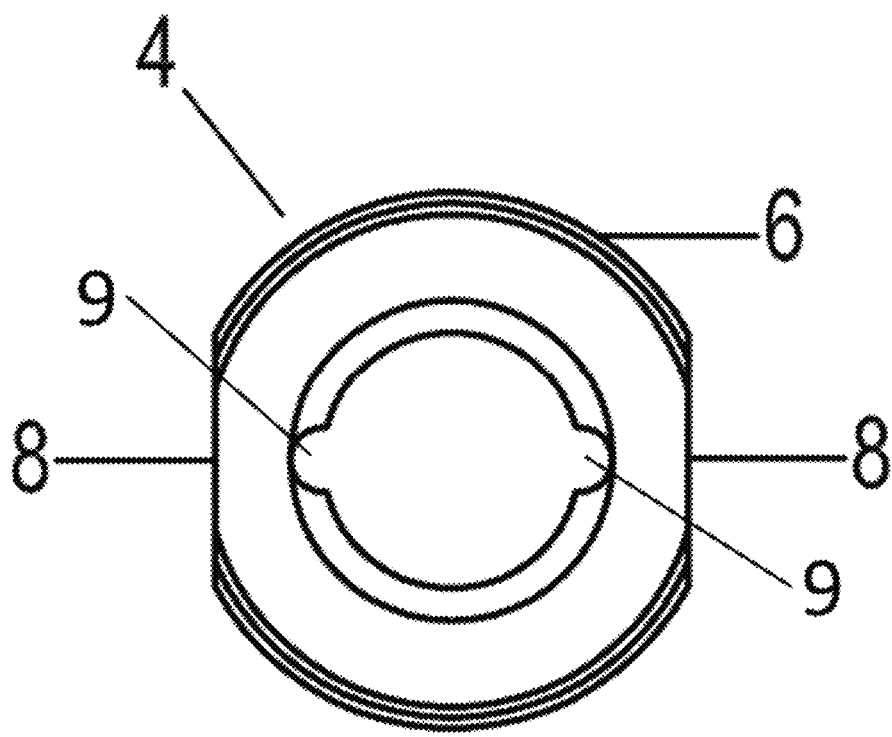
FIG. 3 shows a plain view of a housing of a sensor.

In FIG. 3 a plain view of the housing 4 for a sensor 1 is presented. It shows the first portion 6 of the housing 4 which forms a round opening in the middle. The outer shape and contour of the first portion 6 is radial asymmetrical. The contour of the housing 4 has two flattened segments 8 which are opposite to each other. In this way the sensor 1 can be securely picked at the flattened segment 8, as the flattened segment 8 provide means for a stable grip. Hence, the sensor 1 also can easily be mounted and installed in a device by a pick-and-place machine.

By employing a not radial symmetrical housing 4, the direction the sensor element 2 is facing in the housing 4 as well as the direction of the housing 4 in a device is determined and fixed. As a consequence the position and the direction of the sensor 1 is exactly the same in a device. Sensor elements 2 are dependent on the angle and the distance they face an event they are supposed to measure. As an example, a planar temperature sensor element 2 that faces a heat source with its large surface will absorb more thermal energy than an NTC sensor that is orientated perpendicular to the heat source. By determining the direction of the sensor element 2 in the housing 4 and the direction of the housing 4 in a device by its outer shape and contour it is ensured that the sensor element 2 and thereby the sensor 1 itself works and measures reliable and reproducible values. The grooves 9 are located central relatively to the flattened segments 8 that are part of the outer contour of the housing 4. As the electrical leads 3 are supposed to latch into the grooves 9 and the grooves are fixed compared to the flattened segment 8, the orientation of the sensor element 2 in the housing 4 is predetermined relatively to the flattened segments 8.

In this way it is ensured that the sensor 1 measures reproducible in a given environment where to orientation and location of the housing is specified.

Figure 4:
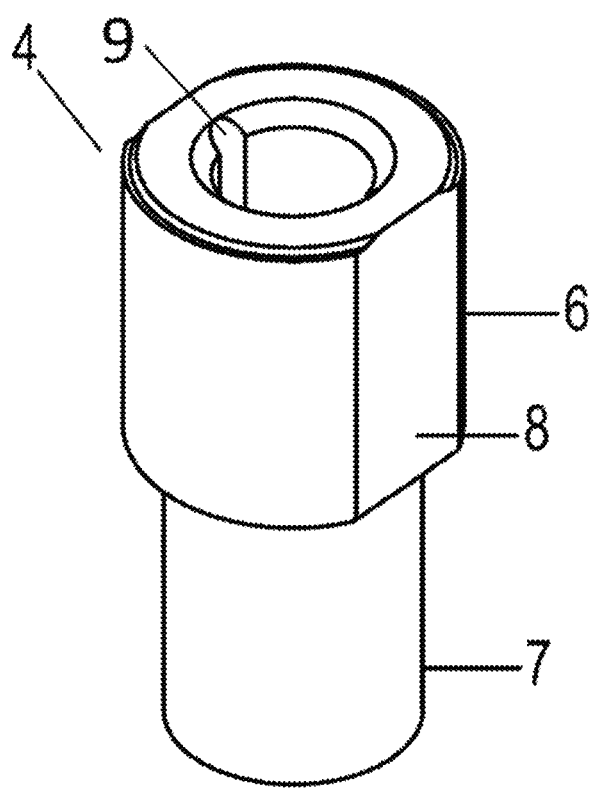
FIG. 4 shows a perspective view of a housing of a sensor.

FIG. 4 shows a perspective view of the housing 4. As described above, the housing 4 has two portions, is radial asymmetrical and has two flattened segments 8 on the first portion 6. It is made out of alumina oxide, which is a metal oxide, with 96% alumina and 4% oxygen. Metal oxides offer a high stability and relatively high thermal conductivity. Moreover, metal oxides are electrical insulators. Therefore, the sensor 1 with a housing 4 made of a metal oxide allows to be used high-voltage applications. Even more so, as the silicone resin 5 is resistant against humidity, which would reduce the breakdown voltage of the sensor. If a high voltage is applied to the electrical leads can short circuits can occur, especially between the protruding electrical leads 3 and the housing 4. A housing 4 made out of an electrical insulator can be beneficial. The sensor 1 employing the housing 4 shown in FIG. 4, which is made out of a metal oxide, can be operated with a voltage of up to 5 kV.

Figure 5:
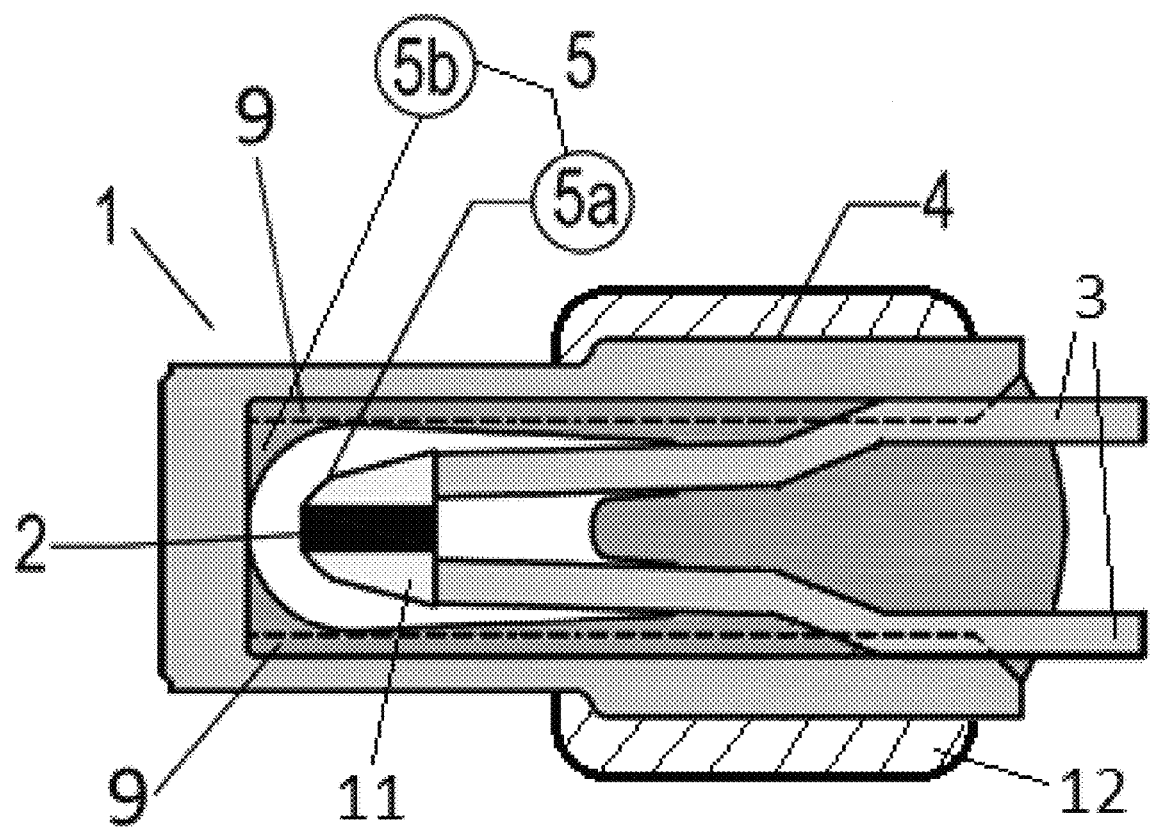
FIG. 5 shows a simplified cross section of the sensor of FIG. 1 arranged in a socket with a hole.

FIG. 5 shows a simplified cross section of the sensor of FIG. 1 arranged in a socket 12 which has a hole. The sensor element 2 is arranged in the second portion 7 of the housing 4 which protrudes through the hole. Therefore, the sensor 1 can measure the properties outside of the socket 12, while maintaining the advantages given by the socket 12, as a reliable position and orientation of the sensor element. The socket 12 has an inner shape which is adapted to the outer shape of the housing 4, as the flattened segments 8. Thus, the arrangement complies with the poka-yoke and reduces mistakes as a wrong orientation while assembling. Also replacing the sensor 1 or dismantling the arrangement for a repair is less risky.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A sensor comprising:
   a sensor element;
   electrical leads connected to the sensor element;
   a housing, having an opening, wherein the sensor element is arranged in the housing such that the electrical leads protrude through the opening; and
   a first silicone resin filling the housing such that the sensor element and the electrical leads are fixed in the housing,
   wherein the housing is divided into a first portion and a second portion,
   wherein the first portion comprises the opening,
   wherein the second portion is located opposite the opening and connected to the first portion,
   wherein an extend of the second portion is smaller than an extend of the first portion, and
   wherein the sensor element is arranged in the second portion of the housing.

2. The sensor according to claim 1, wherein the silicone resin is a hard silicone material.

3. The sensor according to claim 1,
wherein the sensor element is encapsulated in a second silicone resin,
wherein the housing is filled with the second silicone resin, and
wherein the first silicone resin and the second silicone resin are the same silicone resin material.

4. The sensor according to claim 1, wherein the sensor element is connected to the electrical leads by a lead-free solder.

5. The sensor according to claim 4, wherein the solder comprises Sn—Cu or Sn—Ag—Cu(SAC) solder.

6. The sensor according to claim 1, wherein the housing comprises a metal oxide.

7. The sensor according to claim 1, wherein the sensor element is a NTC sensor element.

8. The sensor according to claim 1, wherein a wall thickness of the housing is less than 2 mm.

9. The sensor according to claim 1, wherein the electrical leads have kinks in a portion located inside the housing.

10. The sensor according to claim 1,
wherein the housing comprises two grooves at an inner surface of the housing, and
wherein the grooves extend from the opening along a longitudinal axis into the housing.

11. The sensor according to claim 1, wherein the housing has an outer shape, and wherein the outer shape is radial asymmetrical.

12. The sensor according to claim 1, wherein a wall thickness of the housing in the second portion is smaller than a wall thickness of the housing in the first portion.

13. An arrangement comprising:
the sensor according to claim 1,
a socket,
wherein an extend of a hole in the socket is larger than the extend of the second portion, and
wherein the sensor is arranged in the socket such that the second portion of the sensor protrudes through the hole.

14. An arrangement comprising:
the sensor according to claim 1; and
a socket comprising an inner shape adapted to an outer shape of the sensor,
wherein the sensor is arranged in the socket.

15. The arrangement according to claim 14, further comprising:
a printed circuit board,
wherein the socket is arranged on the printed circuit board and the sensor is electrically connected to the printed circuit board.

16. A smart power meter comprising:
the sensor according to claim 1.

17. The sensor according to claim 1, wherein the housing comprises a ceramic.

18. An arrangement comprising:
a sensor comprising:
a sensor element;
electrical leads connected to the sensor element;
a housing having an opening, wherein the sensor element is arranged in the housing such that the electrical leads protrude through the opening; and
a first silicone resin filling the housing such that the sensor element and the electrical leads are fixed in the housing;
a socket comprising an inner shape adapted to an outer shape of the sensor, wherein the sensor is arranged in the socket; and
a printed circuit board, wherein the socket is arranged on the printed circuit board and the sensor is electrically connected to the printed circuit board.

* * * * *